United States Patent [19]

Willis

[11] 4,251,756
[45] Feb. 17, 1981

[54] REGULATED DEFLECTION CIRCUIT

[75] Inventor: Donald H. Willis, Indianapolis, Ind.
[73] Assignee: RCA Corporation, New York, N.Y.
[21] Appl. No.: 73,038
[22] Filed: Sep. 6, 1979
[51] Int. Cl.³ .............................................. H01J 29/70
[52] U.S. Cl. ..................................... 315/411; 315/400
[58] Field of Search ................................. 315/400, 411

[56] References Cited
U.S. PATENT DOCUMENTS

| | | | |
|---|---|---|---|
| 3,609,447 | 9/1971 | Hirota et al. | 315/400 |
| 3,846,673 | 11/1974 | Hirota et al. | 315/400 |
| 4,006,385 | 11/1975 | Onodera | 315/400 |
| 4,024,432 | 5/1977 | Boekhorst | 315/400 X |
| 4,176,304 | 11/1979 | Scott | 315/411 |

Primary Examiner—Malcolm F. Hubler
Attorney, Agent, or Firm—Eugene M. Whitacre;
William H. Meagher; Joseph J. Laks

[57] ABSTRACT

First and second capacitors are charged from a DC source of unregulated input voltage through the primary winding of a flyback transformer of a horizontal deflection circuit. The average voltage across the first capacitor is established as the voltage difference between the input voltage and the average voltage across the second capacitor. The first capacitor functions as a trace capacitor for a horizontal deflection winding. A switch applies a trace voltage to the horizontal deflection winding to generate a trace deflection current. The switch also applies the voltages developed across the second capacitor and across a flyback transformer secondary winding to a regulator inductance to control the flow of current in the second capacitor. The current flowing through the inductance is varied in order to control the voltage across the second capacitor for regulating a selected deflection circuit quantity.

8 Claims, 3 Drawing Figures

REGULATED DEFLECTION CIRCUIT

BACKGROUND OF THE INVENTION

This invention relates to regulated deflection circuits for television receivers, for example.

In typical television receiver circuitry, the horizontal deflection winding and a trace capacitor are series coupled. The trace capacitor is charged to a trace voltage from a B+ voltage supply through a flyback transformer primary winding. A trace switch then couples the trace capacitor and applies the capacitor's voltage across the deflection winding to generate a trace deflection current. During retrace, the trace switch is nonconductive and the deflection winding and flyback transformer primary winding resonate with a retrace capacitor to generate retrace pulse voltages in the two windings. During retrace, the deflection current reverses in direction preparatory to starting the next deflection interval. The retrace pulse voltage in the flyback transformer primary winding is stepped up by a high voltage winding to generate the high voltage or ultor accelerating potential.

To maintain a constant raster width, the trace voltage developed across the deflection winding and the retrace pulse voltages are regulated. To achieve this result, conventional television receiver regulators, using controllable semiconductor switching elements, develop a regulated B+ supply voltage derived from an unregulated input voltage, such as from a voltage derived from the AC line or mains supply. For greater efficiency, such switching elements typically operate at the relatively high frequencies of 16 or 20 kilohertz.

Other television receiver regulators couple the unregulated input voltage to the flyback transformer primary winding and to the deflection winding and trace capacitor. A second capacitor is coupled to the trace capacitor and is charged to a voltage which follows the input voltage variations. The trace voltage, established as the difference between the input voltage and the second capacitor voltage, is thereby regulated. The charge-discharge of the second capacitor occurs at the 16 kilohertz frequency of horizontal deflection. The voltage developed across the second capacitor is controlled, in part, by varying the current flow in an inductance coupled to the second capacitor. Such regulators are described in the U.S. patent application of W. Truskalo, Ser. No. 073040, concurrently filed herewith, entitled "REGULATED DEFLECTION CIRCUIT", and in the U.S. patent application of D. H. Willis, Ser. No. 06/058,659, filed July 19, 1979, entitled "REGULATED DEFLECTION CIRCUIT WITH REGULATOR SWITCH CONTROLLED BY DEFLECTION CURRENT", said Willis application being a continuation of Ser. No. 926,337 filed July 20, 1978, now abandoned.

The regulator in the aforementioned Truskalo and Willis applications may be required to regulate over relatively large input voltage variations, and accordingly may be required to vary the voltage across the second capacitor over a relatively large range of voltages. For example, in a typical transistorized horizontal deflection circuit, the trace voltage developed across the trace capacitor approximately equals +110 volts. For input voltages which vary between +180 volts and +120 volts, the voltage across the second capacitor must vary between +70 volts and +10 volts, a voltage ratio of 7 to 1. It is desirable to design a regulator with a range of regulation which can accommodate such large voltage variations.

SUMMARY OF THE INVENTION

A first flyback transformer winding of a deflection circuit charges a trace capacitance and a second capacitance from a source of unregulated DC voltage. The DC value of the voltage across the trace capacitance is constrained to assume a value representative of the voltage between the unregulated DC voltage and the DC value of the voltage across the second capacitance. A switch applies a trace voltage across a deflection winding for generating a trace deflection current. The switch also applies the voltage developed across the second capacitance and the voltage developed across a second flyback transformer winding to an inductance for generating a current in the inductance that controls the current flow in the second capacitance. A control circuit responsive to a deflection circuit quantity varies the current flow in the inductance for controlling the voltage across the second capacitance for regulating the deflection circuit quantity.

DESCRIPTION OF THE INVENTION

Figure 1:
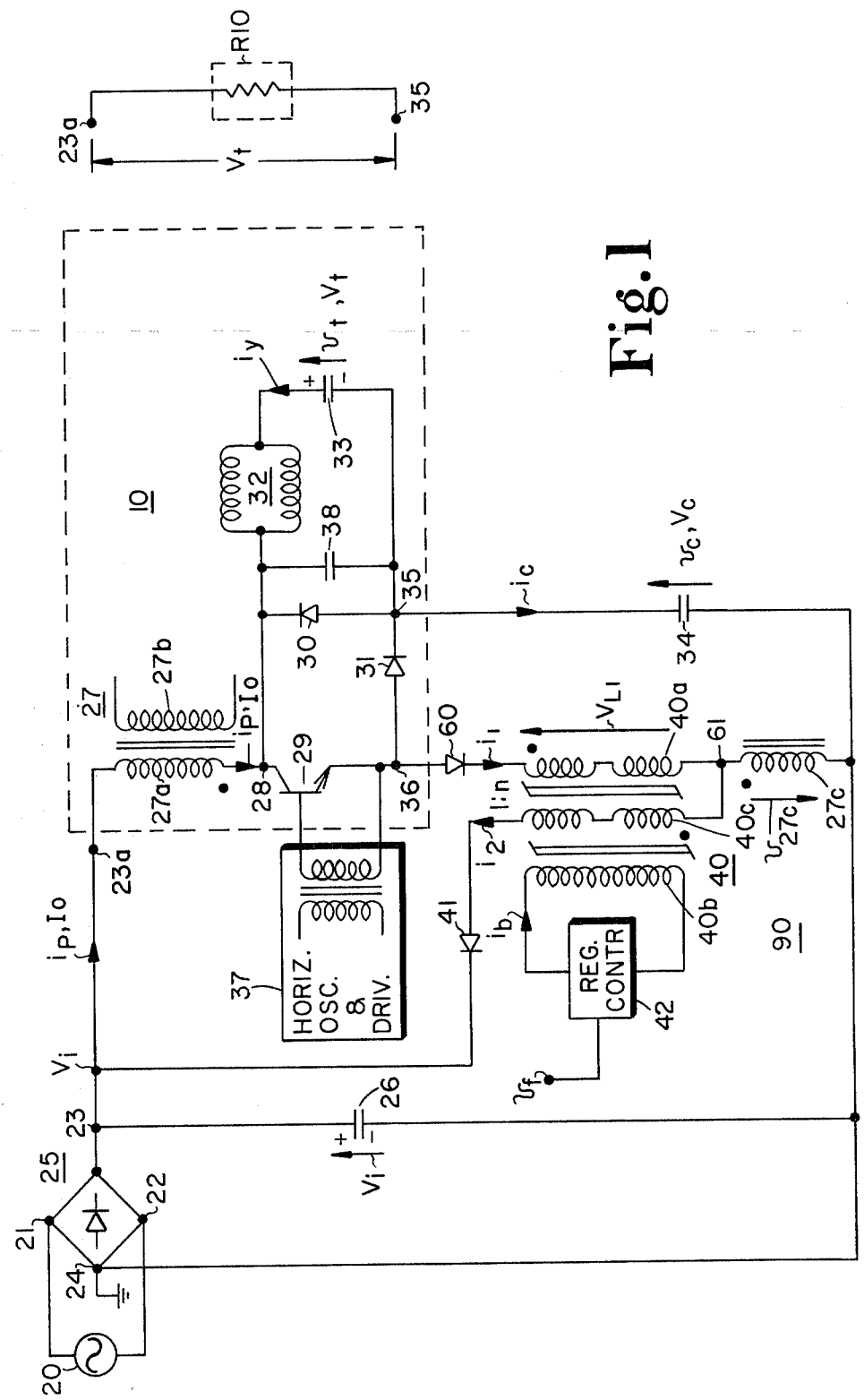
FIGS. 1 and 3 illustrate regulated deflection circuits embodying the invention.

In FIG. 1, a source of alternating current power line voltage 20 is coupled across input terminals 21 and 22 of a full-wave bridge rectifier 25. A filter capacitor 26 is coupled across output terminals 23 and 24 of rectifier 25, with terminal 24 comprising the ground or common current return terminal. A filtered but unregulated DC input voltage $V_i$ is developed across capacitor 26.

Input voltage $V_i$ is applied to an input terminal 23a of a horizontal deflection circuit 10, of a television receiver, for example. Horizontal deflection circuit 10 includes a horizontal output or flyback transformer 27 with one terminal of a primary winding 27a coupled to input terminal 23a. The other terminal of flyback transformer primary winding 27a is coupled to a terminal 28.

Energy is transferred from input terminal 23a to various television receiver load circuits by coupling the load circuits to flyback transformer secondary windings, schematically indicated in FIG. 1 as a single load winding 27b. For example, winding 27b may, in part, represent a high voltage winding which provides the ultor accelerating potential for the television receiver cathode ray tube.

Coupled between terminal 28 and a terminal 35 is the series arrangement of a horizontal deflection winding 32 and an "S" shaping or trace capacitor 33. Also coupled between terminals 28 and 35 are a retrace capacitor 38, damper diode 30 and the series combination of a horizontal output transistor 29 and a diode 31. The emitter electrode of transistor 29 is coupled to a terminal 36, the anode of diode 31.

Coupled between terminal 35 and ground is a second capacitor 34. Coupled between terminal 36 and ground are elements of a regulator 90 comprising serially coupled diode 60, winding 40a of a saturable reactor 40, and a secondary winding 27c of flyback transformer 27. Secondary winding 27c functions, in part, to alter the regulation range of regulator 90, as will be further explained.

One terminal of a second saturable reactor winding 40c is coupled to a terminal 61, the junction of saturable reactor winding 40a and flyback transformer secondary winding 27c. The other terminal of saturable reactor winding 40c is coupled to input terminal 23a through a diode 41. A regulator control circuit 42, responsive to an applied feedback voltage $V_f$, generates a bias current $i_b$ flowing in a saturable reactor bias winding 40b. The bias current $i_b$ generates a bias magnetic flux in the magnetic core of saturable reactor 40 for controlling the effective inductance of saturable reactor windings 40a and 40b. Embodiments of regulator control circuit 42 and saturable reactor 40 may be similar to those described in the aforementioned Truskalo application Ser. No. 073040, hereby incorporated by reference.

Horizontal deflection circuit 10 may be considered to act as an equivalent load impedance $R_{10}$ coupled between input terminal 23a and terminal 35, as illustrated schematically in FIG. 1. The value of impedance $R_{10}$ will vary with variations in the load current requirements of the circuits coupled to flyback transformer load winding 27b. The input or flyback primary winding current $i_p$ flowing through primary winding 27a includes a DC load current component $I_0$ which varies with loading changes.

Since capacitor 34 is coupled between terminal 35 and ground or current return terminal 24, the voltage across the equivalent impedance $R_{10}$ equals the voltage difference between the input voltage $V_i$ and the voltage across the capacitor. With regulator 90 controlling the voltage across capacitor 34, a regulated voltage may be developed across impedance $R_{10}$.

During a start-up interval, after the power line voltage is first applied between terminals 21 and 22, input voltage $V_i$ is developed across capacitor 26 and current begins to flow from input terminal 23a through flyback transformer primary winding 27a to charge the serially coupled trace capacitor 33 and capacitor 34. A conventional horizontal oscillator and driver 37 provides a conventional square-wave voltage for switching conduction of transistor 29 each deflection cycle so as to generate a horizontal trace current in deflection winding 32 during the horizontal trace interval. After transistor 29 is switched into nonconduction by the square-wave voltage, a horizontal retrace pulse voltage is developed in retrace capacitor 38, and a retrace current flows in deflection winding 32 during the horizontal retrace interval.

As capacitors 33 and 34 continue to charge, the peak-to-peak horizontal trace current and the retrace pulse voltage amplitudes continue to increase until a steady state or equilibrium condition exists wherein a trace voltage $v_t$ is established across trace capacitor 33 and an equilibrium voltage $v_c$ is developed across capacitor 34.

During the entirety of the horizontal trace interval, terminals 28 and 35 are coupled together due to either the conduction of damper diode 30, or the simultaneous conduction of transistor 29 and diode 31. The trace capacitor 33 is coupled to horizontal deflection winding 32 and the trace voltage $v_t$ is applied across the winding to produce the positive-going sawtooth deflection current $i_y$, of peak amplitude $I_p$, during the trace interval $t_c$–$t_i$, as illustrated in FIG. 2a. At time $t_f$, the center of trace, the deflection current reverses direction.

Assume, for explanatory purposes, that flyback transformer primary winding 27a functions as a current source producing a primary winding current $i_p = I_0$, a constant current representing the average or DC load current component of the primary winding current, and that the voltages across capacitors 33 and 34 during a given horizontal deflection cycle equal constant DC voltages $V_t$ and $V_c$ respectively representing the average voltages developed across the capacitors. During a first portion of trace, between times $t_c$–$t_d$, with damper diode 30 conducting and transistor 29 cut off, the primary winding current $I_0$ flows from terminal 28 to terminal 35 to charge capacitor 34 with a current $i_c = I_0$, as illustrated in FIG. 2c by the current arrows 34a between times $t_c$–$t_d$, an upwardly directed current arrow indicating a positive or charging current $i_c$. Although the current in flyback transformer winding 27a is not constant, for explanatory purposes, the flyback transformer will be assumed to act as a constant current source. This source thus charges capacitor 34 during horizontal retrace also, as illustrated by the current arrows 34a between times $t_a$–$t_c$.

At time $t_d$, the square-wave voltage illustrated in FIG. 2b as a voltage $V_{37}$, produced by horizontal oscillator and driver 37, switches states and turns on horizontal output transistor 29. Terminals 35, 28 and 36 are now coupled together by way of a damper diode 30 and the collector-to-emitter path of transistor 29. Terminal 36 assumes the capacitor 34 voltage $V_c$ forward biasing diode 60 and applying the voltage $V_c$ to saturable reactor winding 40a. At time $t_h$ of FIG. 2b, square-wave voltage $V_{37}$ again switches states, cutting off conduction of transistor 29 at the end of trace at time $t_i$.

During the conduction time of transistor 29, between times $t_d$–$t_i$, the voltages developed in both capacitor 34 and flyback transformer secondary winding 27c are applied to saturable reactor winding 40a. As illustrated in FIG. 2e, the voltage $v_{27c}$ across flyback transformer secondary winding 27c during the trace interval $t_c$–$t_i$ ideally equals a scan voltage $V_s$, referenced as a positive voltage, and equals a negative retrace pulse voltage of peak amplitude $-V_r$ during the retrace interval $t_a$–$t_c$.

As illustrated in FIG. 2f, during conduction of transistor 29, between times $t_d$–$t_i$, the voltage $v_{L1}$ developed across saturable reactor winding 40a equals an applied voltage $V_{L1}$ equal to the sum of the voltages $V_c$ and $V_s$ applied by capacitor 34 and flyback transformer secondary winding 27c. Thus, as illustrated in FIG. 2b, beginning at time $t_d$, a positively sloped sawtooth current $i_1$ flows in saturable reactor winding 40a, reaching a peak magnitude $I_1$ at the end of trace at time $t_i$. The slope of the current $i_1$ is proportional to the slope ratio $V_{L1}/L_1$, where $L_1$ represents the effective inductance of saturable reactor winding 40a as determined in part by the bias current $i_b$ flowing in saturable reactor winding 40b.

At the beginning of retrace, horizontal output transistor 29 becomes nonconductive. Current $i_1$ in saturable reactor winding 40a ceases to flow, as illustrated in FIG. 2b at time $t_a$ or time $t_i$. To maintain continuity of magnetic flux in the core of saturable reactor 40, a voltage is induced in saturable reactor winding 40c forward biasing diode 41 into conducting a return current $i_2$ during an energy recovery interval $t_a$–$t_b$, as illustrated in FIG. 2c. At time $t_b$, substantially all the energy stored in saturable reactor 40, as represented by the peak current $I_1$ flowing in winding 40a, or the peak current $I_2$ flowing in winding 40c, is returned to the input supply filter capacitor 26.

The voltage across saturable reactor winding 40c during the energy recovery interval is transformed to saturable reactor winding 40a as a voltage $-n(V_i+v_{27c})$, where n equals the turns ratio of saturable reactor winding 40a to saturable reactor winding 40c, as illustrated in FIG. 2f between times $t_a$–$t_b$. Between times $t_b$–$t_d$, when no current flows in either winding 40a or 40c, the voltage $v_{L1}$ across winding 40a is zero.

The current difference between the primary winding current $I_0$ and the saturable reactor winding current $i_1$ equals the current $i_c$ flowing in capacitor 34, as illustrated by the current arrows 34a between times $t_d$–$t_i$. At time $t_e$, the primary winding and saturable reactor winding currents are equal resulting in no current flow in capacitor 34. After time $t_e$, the current $i_c$ is negative and represents a discharge current, as illustrated by the downwardly pointing arrows 34a between times $t_e$–$t_i$.

After time $t_e$, as evidenced by the equal magnitude current arrows 32a' and 34a' of FIGS. 2a and 2c at time $t_g$, deflection winding current $i_y$ is greater than the current $i_c$ flowing in capacitor 34. Damper diode 30 becomes reverse biased. In order to maintain terminals 28 and 35 coupled together for the remainder of the trace interval, diode 31 becomes forward biased and conducts current between times $t_g$–$t_i$.

Under equilibrium operating conditions, the average value of the current $i_c$ flowing in capacitor 34 each deflection cycle equals zero. The charge $q_p$ flowing into capacitor 34 from terminal 35, as represented in FIG. 2c by the area $q_p$ encompassed by the upwardly pointing arrows 34a, must, in equilibrium, equal the charge $q_n$ flowing away from capacitor 34 into terminal 35 as represented by the area $q_n$ encompassed by the downwardly pointing arrows 34a of FIG. 2c. Furthermore, as the DC component $I_0$ of the input or flyback transformer primary winding current $i_p$ flowing into terminal 23a can only flow out of terminal 36 and into saturable reactor winding 40a, the average value of the saturable reactor winding current $i_1$ must, in equilibrium, equal the DC current $I_0$.

The voltage $V_c$ developed across capacitor 34, in equilibrium, is constrained to assume a value which provides for a voltage $V_{L1}$ across saturable reactor winding 40a which enables the total charge $q_p$ added to capacitor 34 during a deflection cycle to be equal to the total charge $q_n$ removed from the capacitor at a given load current $I_0$ and effective inductance $L_1$.

Consider a nonequilibrium situation wherein, for example, the voltage across capacitor 34 equals a voltage $V_c'$ which is less than the equlibrium voltage $V_c$, as may occur during start-up. The voltage $V_{L1}' = V_s + V_c'$ across saturable reactor winding 40a is less than the equilibrium value $V_{L1}$. The slope of the saturable reactor winding current is less or shallower than the slope of waveform $i_1$ of FIG. 2c, indicating that, for this nonequilibrium condition, the charge added to capacitor 34 during a deflection cycle is greater than the charge removed. The voltage across capacitor 34 and the slope of the saturable reactor winding current increase until the equilibrium voltage $V_c$ is developed across capacitor 34.

The DC or average value $V_t$ of the trace voltage $v_t$ assumes a voltage representative of the algebraic difference between the unregulated DC input voltage $V_i$ and the average or DC voltage $V_c$ across capacitor 34. The peak-to-peak trace current in deflection winding 32 and the windings of flyback transformer 27 are a function of the average trace voltage $V_t$. The trace voltage $V_t$, developed across terminals 23a and 35 or across the equivalent load impedance $R_{10}$, the raster width, and the high voltage may each be regulated by controlling the voltage $V_c$.

Regulator 90 of FIG. 1 varies the effective inductance $L_1$ of saturable reactor winding 40a in response to a feedback voltage $v_f$ representative of the change in a deflection circuit quantity such as the trace voltage or a retrace pulse voltage amplitude in such a manner as to regulate or maintain that quantity constant. Assume, for example, that the quantity to be regulated is the trace voltage $V_t$. Should the input voltage decrease to a value $V_i$, the voltage $V_t$ will momentarily decrease. Regulator control circuit 42 senses the trace voltage decrease and generates an increased bias current $i_b$ in saturable reactor bias winding 40b. The effective inductance of saturable reactor winding 40c decreases to a lesser value $L_1'$.

The slope of the saturable reactor winding current is greater or steeper than that depicted by the waveform $i_1$ in the equilibrium condition of FIG. 2c. The charge added to capacitor 34 during a deflection cycle in this nonequilibrium condition is less than the charge removed. The voltage across capacitor 34 decreases, as does the slope of the saturable reactor winding current, until equilibrium is reattained at a lower voltage $V_c'$ across capacitor 34. This lower voltage $V_c'$ compensates for the lower input voltage $V_i'$ in order to maintain the trace voltage $V_t$ constant, as required.

By controlling the current flowing through an inductance, such as saturable reactor winding 40a, the current flowing in capacitor 34 and the voltage developed across the capacitor may be controlled in order to regulate a selected quantity associated with horizontal deflection circuit 10. A feature of the invention is to increase the regulation range obtainable from regulator 90 by applying to a regulator inductance, such as saturable reactor winding 40a, a voltage in addition to the voltage developed across capacitor 34. As illustrated in FIG. 1, such additional voltage may be obtained from flyback transformer secondary winding 27c.

Assume, illustratively, that FIG. 2c represents an extreme condition of the deflection circuit operating range of minimum input voltage $V_i$, and that it is desired to design regulator 90 to extend the operating range to even lower input voltage values. Regulator 90 must therefore be designed to be capable of developing a smaller voltage $V_c$ across capacitor 34 in order to maintain a constant predetermined trace voltage $V_t$. For a given primary winding load current $I_0$, the slope ratio $V_{L1}/L_1$, representing the slope of saturable reactor winding current $i_1$, will not substantially change. As $V_{L1} = V_s + V_c$, to maintain an unchanged slope ratio at a smaller designed voltage $V_c$, the scan voltage $V_s$, developed across flyback secondary winding 27c during trace, is designed to be of larger value.

Such design flexibility is not readily obtainable without the use of the flyback transformer secondary winding. For example, it may be possible to extend the deflection circuit operating range to lower minimum input voltages by designing regulator 90 to provide a smaller effective inductance $L_1$ for saturable reactor winding 40a. Such a solution, however, may require regulator control circuit 42 to generate an undesirably large bias current $i_b$ in winding 40b.

Alternatively explained, without use of flyback transformer secondary winding 27c, regulator 90 must vary the effective inductance of saturable reactor winding 40a in accordance with the ratio $V_{L1(max)}/V_{L1(min)} = V_{c(max)}/V_{c(min)}$. Such a ratio may attain a value of 7 or 8 to 1 for typical transistorized deflection circuits. It may be relatively difficult for saturable reactor 40 to accommodate such a relatively large ratio range. By coupling the voltage developed across flyback transformer secondary winding 27c to saturable reactor winding 40a, the ratio $V_{L1(max)}/V_{L1(min)}$ now equals $(V_s + V_{c(max)})/(V_s + V_{c(min)})$. For a typical value of 20 volts for the voltage $V_s$, the ratio now becomes about 3 to 1, a ratio value that saturable reactor 40 can more readily accommodate.

Designing regulator 90 to operate with a larger flyback transformer secondary winding scan voltage $V_s$ provides regulator 90 with a voltage boost capability. That is to say, regulator 90 may be able to maintain the trace voltage $V_t$ at a boosted voltage that is greater than the input voltage $V_i$. Such a boosted trace voltage requires that the voltage across capacitor 34 assume an opposite polarity or negative voltage with respect to ground. Thus, the flyback transformer secondary winding scan voltage $V_s$ is designed to be large enough to maintain an appropriate positive voltage $V_{L1}$ across saturable reactor winding 40a between times $t_d$-$t_i$ of FIG. 2c, for all operating conditions of deflection circuit 10.

It may be desirable to design regulator 90 with the winding polarity of flyback transformer secondary winding 27c that is reversed with respect to that illustrated in FIG. 1. That is to say, the scan voltage $V_s$ is negative, as referenced with respect to terminal 61. Such a winding polarity reversal may be desirable in order to extend the deflection circuit operating range at relatively high input voltages with the load current $I_0$ at a minimum.

Flyback transformer secondary winding 27c may be used in other regulator circuits which adjust the voltage $V_c$ across capacitor 34 by controlling the current flow through a regulator inductance. Such other regulator circuits are described in the aforementioned Willis application Ser. No. 06/058,659, hereby incorporated by reference.

Figure 3:
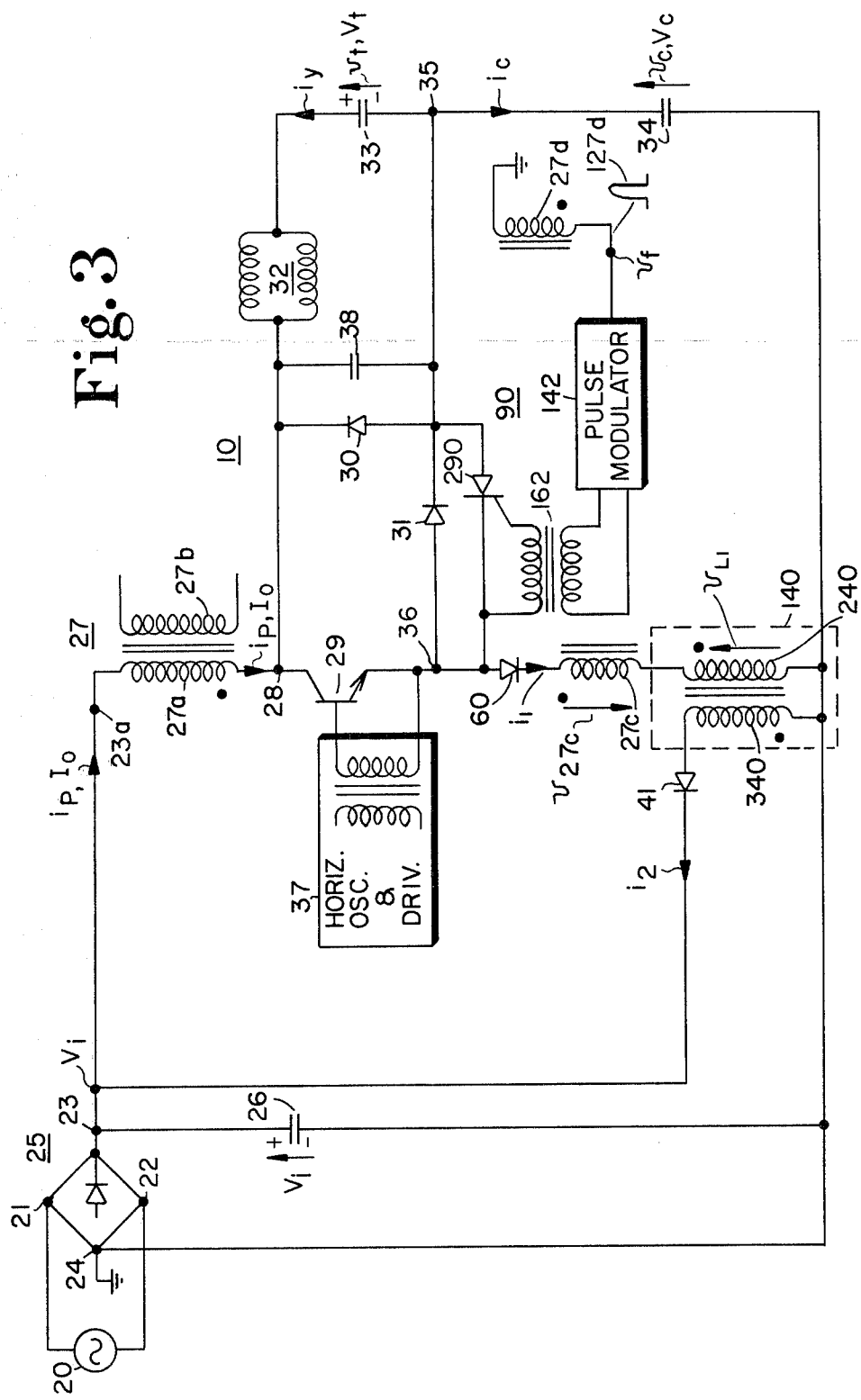

As illustrated in FIG. 3, a controllable switch 290 is coupled to flyback transformer secondary winding 27c through diode 60. The controllable switch may comprise, for example, a silicon controlled rectifier SCR 290 coupled across diode 31 and poled to conduct current in a direction opposite that of diode 31. Elements of the circuits of FIGS. 1 and 3 which are identically labelled operate similarly in both circuits. The inductance associated with regulator 90 comprises a regulator transformer 140 with a first winding 240 coupled to both capacitor 34 and flyback transformer secondary winding 27c. A second winding 340 of regulator transformer 140 is coupled to input terminal 23a through diode 41, for recovering, during at least a portion of the retrace interval, the energy stored in the regulator transformer core at the end of trace.

Regulator 90 controls the voltage $V_c$ across capacitor 34, not by controlling the effective inductance value of a winding coupled to the capacitor, but by controlling the conduction time of SCR 290. A regulator control circuit, comprising a conventional pulse position or pulse width modulator 142, applies a gating pulse to the gate of SCR 290 through a gate transformer 162, to turn the SCR on at a controlled instant within each horizontal deflection cycle. The SCR turn-on instant is varied in response to feedback voltage $v_f$ representative of a deflection circuit quantity to be regulated. As illustrated in FIG. 3, the feedback voltage $v_f$ comprises a retrace pulse voltage 127d obtained from a flyback transformer secondary winding 27d.

Figure 2:
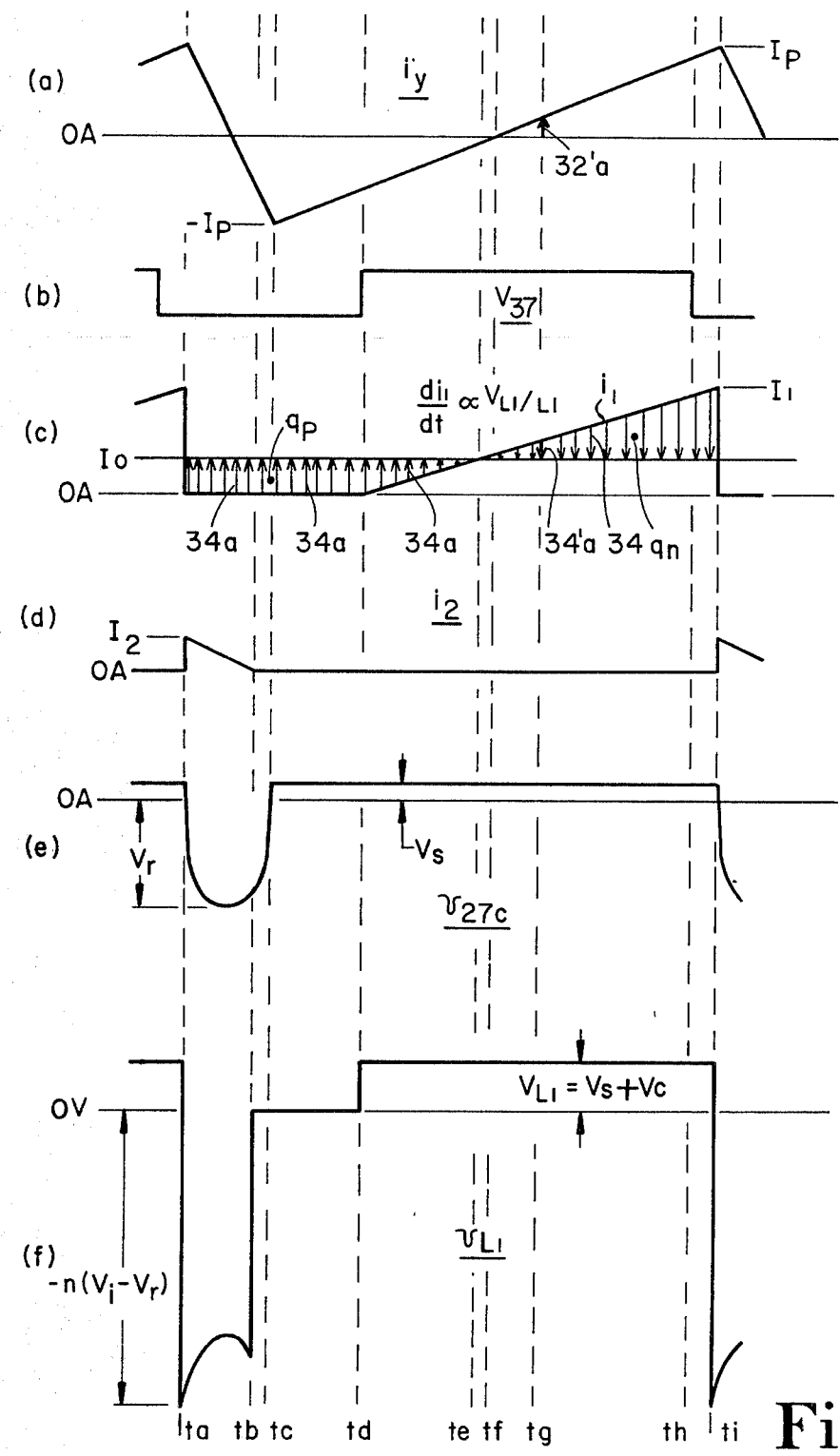
FIG. 2 illustrates waveforms associated with the circuits of FIGS. 1 and 3.

The waveforms illustrated in FIG. 2 generally apply also to the circuit of FIG. 3. The current $i_1$ of FIG. 2c represents the current flowing in regulator transformer winding 240 and the voltage $v_{L1}$ of FIG. 2f represents the voltage developed across this winding. It should be noted that the voltage $v_{L1}$ between times $t_a$-$t_b$ no longer equals $n(V_i - V_r)$ of FIG. 2f, but equals the transformed input voltage of $nV_i$.

Generally, regulator transformer current $i_1$ will flow in the regulator transformer winding 140 whenever terminal 36 is coupled to terminal 35 due to the conduction of various ones of the semiconductor switching elements such as transistor 29, diodes 30 and 31, and SCR 290. FIG. 2c, as applicable to the circuit of FIG. 3, illustrates a situation where SCR 290 is turned on at or after the turn-on of horizontal output transistor 29.

The current $i_1$ flows in regulator transformer winding 240, beginning at time $t_d$, as illustrated in FIG. 2c. The slope of the current $L_1$ is still proportional to the slope ratio $V_{L1}/L_1$, but now represents the relatively fixed effective inductance of regulator transformer winding 240.

Regulation and control of the voltage $V_c$ across capacitor 34 is achieved by varying the current $i_1$ by varying the turn-on instant of SCR 290 within the interval $t_a$-$t_d$. For example, an SCR turn-on instant advanced toward the time $t_a$ results in a new equilibrium operating condition at a reduced voltage across capacitor 34, for a given load current $I_0$, as is required when the unregulated input voltage decreases. It should be noted that if SCR 290 is turned on prior to the completion of the energy recovery interval, the recovery interval will cease upon turn-on of the SCR, with the flow of return current $i_2$ in winding 340 diminishing to zero shortly thereafter. The current $i_1$ will begin to flow in winding 240 upon the SCR turn-on at some value which maintains continuity in the core of transformer 140 of the flux generated by the current $i_2$.

By applying the voltage developed in flyback transformer secondary winding 27c to regulator transformer winding 240, the design range of operation of regulator 90 of FIG. 3 may be extended for reasons similar to those previously described with regard to extending the design range of regulator 90 of FIG. 1. Assume, illustratively, that the waveform of FIG. 2c represents an extreme operating condition of maximum input voltage, and that it is desired to extend the design range to operate under even greater input voltages. Regulator 90 must therefore be capable of developing a larger voltage across capacitor 34. Delaying the turn-on of SCR 290 beyond the time $t_d$ will not be effective, because the start of $i_1$ current flow cannot be delayed beyond time $t_d$, the turn-on instant of transistor 29. Thus, the maximum voltage $V_{L1}$ for a given load current $I_0$ and fixed inductance value $L_1$ is fixed by the turn-on instant of transistor 29. In order to provide for an increase in the designed maximum attainable voltage $V_c$ for a fixed voltage $V_{L1}$, flyback transformer secondary winding 27c may be designed to apply to regulator transformer winding 240 a lower scan voltage $V_s$, thereby compensating for the designed increase in voltage across capacitor 34.

Various modifications to the circuits of FIGS. 1 and 3, similar to those described in the aforementioned U.S.

patent applications, may be made without substantially altering basic circuit operations. For example, flyback transformer secondary winding 27c of FIG. 1 may be coupled between saturable reactor winding 40c and diode 41. If needed, the energy recovery interval may be adjusted by appropriate selection of winding 27c polarity and turns ratio. In FIG. 3, the terminal of regulator transformer winding 340 that is remote from the cathode of diode 41 may be coupled to terminal 35 instead of to ground terminal 24, if a longer discharge interval is needed for capacitor 34. An analagous situation applies for the circuit of FIG. 1.

In FIG. 1 or 3, the terminal of capacitor 34 remote from terminal 35 may be coupled to a reference terminal other than terminal 24. The remote capacitor terminal may, for example, be coupled to terminal 23a. In this configuration, the regulated voltage $v_t$ will be developed across capacitor 34. A voltage difference, established as the unregulated input voltage less the trace voltage $v_t$, is then developed between terminals 35 and 24. This voltage difference is controllably varied by regulator 90 in order to regulate the trace voltage $V_t$. In this configuration, the operation of the deflection and regulator circuits is basically the same as that described for the circuits of FIGS. 1 and 3, even though the charge-discharge sequences for the various capacitors may be slightly different.

What is claimed is:

1. A regulated deflection circuit, comprising:
 a source of unregulated DC voltage;
 a deflection winding;
 a trace capacitance coupled to said deflection winding;
 a second capacitance coupled to said first capacitance and said source of unregulated voltage;
 a first flyback transformer winding coupled to at least one of said trace and second capacitances for charging at least one of said trace and second capacitances from said source of unregulated voltage, the DC value of the voltage across said trace capacitance constrained to assume a value representative of the voltage difference between said unregulated DC voltage and the DC value of the voltage across said second capacitance;
 inductance means;
 a second flyback transformer winding;
 switching means coupled to said deflection winding for applying a trace voltage to said deflection winding for generating a trace deflection current in said deflection winding,
 said switching means coupling said second flyback transformer winding and said second capacitance to said inductance means for applying the voltages developed across said second flyback transformer winding and across said second capacitance to said inductance means to generate a current in said inductance means; and
 means coupled to said inductance means and responsive to a deflection circuit quantity for controlling the current in said inductance means to effect regulation of said deflection circuit quantity.

2. A circuit according to claim 1 wherein said controlling means comprises a controllable switch, the conduction time of said controllable switch being varied in response to said deflection circuit quantity for varying the flow of current in said inductance means.

3. A circuit according to claim 1 wherein said inductance means comprises a saturable reactor, a first winding of said saturable reactor coupled to said second capacitance by said switching means.

4. A circuit according to claim 3 wherein said controlling means comprises a bias winding of said saturable reactor and a control circuit coupled to said bias winding and responsive to said deflection circuit quantity for generating a bias current in said bias winding to vary the effective inductance of said first winding.

5. A circuit according to claims 1, 2 or 3 including a winding magnetically coupled to said inductance means for recovering energy stored in said inductance means.

6. A circuit according to claims 1, 2 or 3 wherein said switching means couples said first flyback transformer winding and one of said inductance means and second flyback transformer winding to a junction terminal of said second capacitance and the series arrangement of said deflection winding and said trace capacitance.

7. A circuit according to claim 6 wherein said switching means comprises a damper diode coupled across the series arrangement of said deflection winding and said trace capacitance, and a serially coupled horizontal output transistor and second diode coupled across said series arrangement.

8. A circuit according to claim 7 wherein said inductance means is coupled to the junction of said horizontal output transistor and said second diode.

* * * * *